United States Patent [19]

Smith

[11] Patent Number: 5,032,784
[45] Date of Patent: Jul. 16, 1991

[54] SPECTRUM ANALYZER USING SYNC INTERCONNECT

[76] Inventor: F. Patterson Smith, 1324 Harris Rd., Dresher, Pa. 19025

[21] Appl. No.: 544,999

[22] Filed: Jun. 25, 1990

Related U.S. Application Data

[63] Continuation of Ser. No. 342,175, Apr. 24, 1989, abandoned.

[51] Int. Cl.$^5$ ............................................. G01R 23/16
[52] U.S. Cl. ............................... 324/77 B; 324/121 R
[58] Field of Search ................. 324/77 R, 77 A, 77 B, 324/77 C, 77 CS, 77 D, 77 E, 77 F, 77 G, 121 R, 72, 72.5, 78 R

[56] References Cited

U.S. PATENT DOCUMENTS

| | | | |
|---|---|---|---|
| 4,015,087 | 3/1977 | Stewart | 324/77 B |
| 4,348,637 | 9/1982 | Hayes, III et al. | 324/77 B |
| 4,492,917 | 1/1985 | Inami et al. | 324/77 A |
| 4,524,444 | 6/1985 | Efron et al. | 324/73.1 |
| 4,665,494 | 5/1987 | Tanaka et al. | 324/77 B |
| 4,940,931 | 7/1990 | Katayama et al. | 324/121 R |

Primary Examiner—Michael J. Tokar

[57] ABSTRACT

In a frequency specturm analyzer system, horizontal interconnect between RF and display functions is eliminated by introducing a sync pulse on the vertical interconnect.

11 Claims, 4 Drawing Sheets

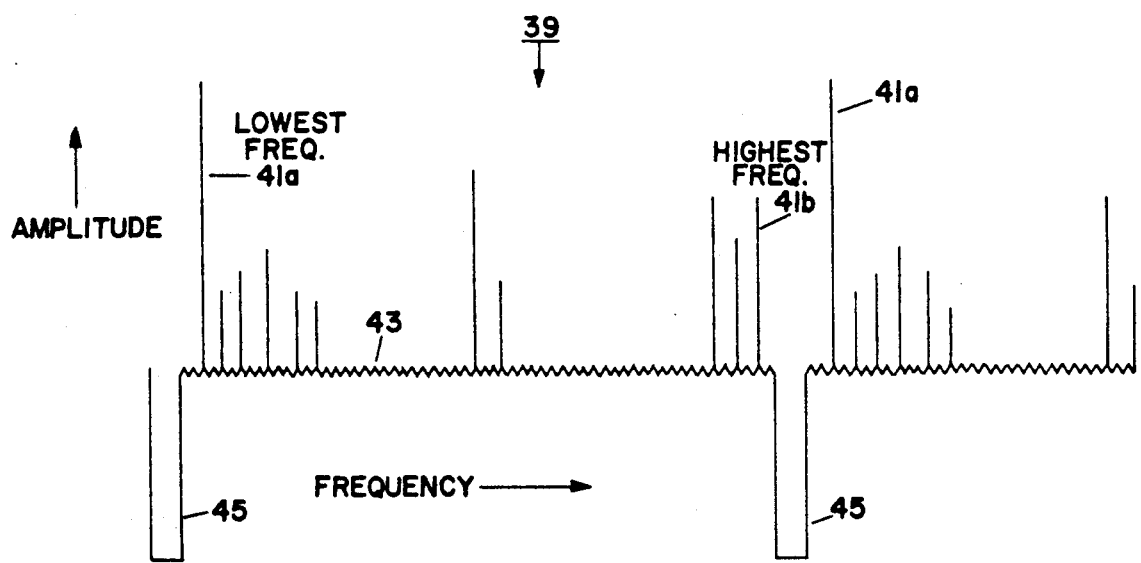

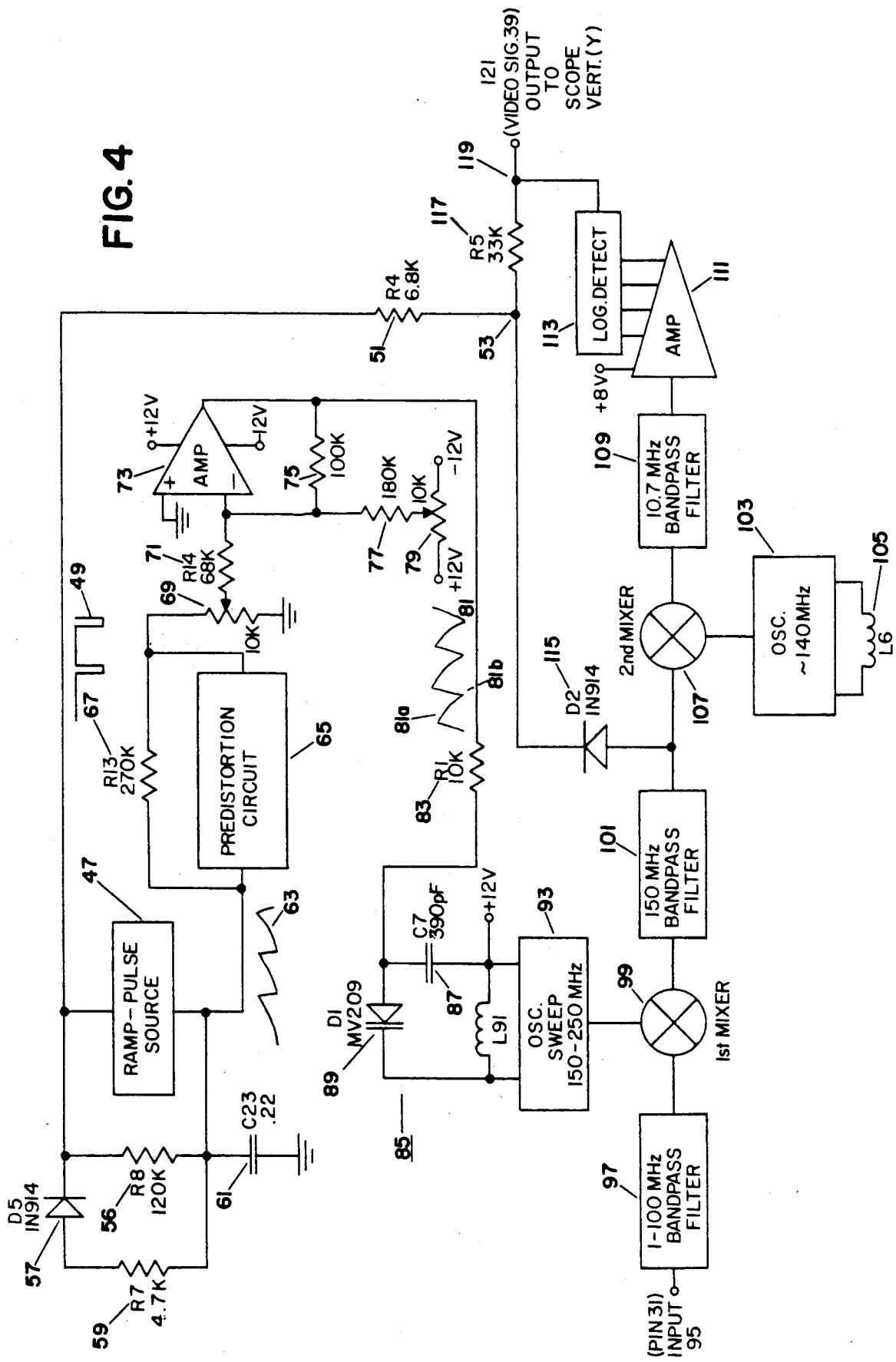

SPECTRUM ANALYZER USING SYNC INTERCONNECT

This application is a continuation of application Ser. No. 342,175, filed 4/24/89, and now abandoned.

BACKGROUND OF THE INVENTION

This invention relates to spectrum analyzer systems and circuits for spectrum analyzer systems and more specifically relates to an improved spectrum analyzer system where the frequency spectrum display is generated on an oscilloscope using just the vertical (Y) axis input of the scope and but a single cable interconnect.

A spectrum analyzer is an apparatus used primarily by engineers for radio frequency electronic design. It comprises a narrow band radio frequency (RF) receiver which is caused to electronically, frequency-scan the input signals, and to produce a calibrated video display of this radio frequency spectrum. Typically, such a display is of frequency as a function of horizontal location and amplitude as a function of vertical rise.

Early equipment had separate RF circuit and display circuit sections, with a multitude of cables between them. Many currently available spectrum analyzers utilize an RF section (subsystem) circuit with an integral CRT display, with both units being incorporated into a single housing.

A few prior spectrum analyzers are two piece; i.e., they have a discrete RF circuit and use a standard oscilloscope as the display component. The RF circuit in these units is a narrow band RF receiver with logarithmic output. This allows for the measurement of input signals having a large dynamic range. The output of the RF receiver is fed to the scope vertical (or Y) input. The receiver frequency is swept from the lowest to the highest desired. A sawtooth wave signal, with its amplitude being essentially a linear function of the receiver frequency, is output to the scope horizontal (or X) input. Controls of frequency and amplitude range are designed within the RF section circuitry. The oscilloscope used must have an external horizontal (X axis) input.

SUMMARY AND OBJECTS OF THE INVENTION

An object of the present invention is to provide a spectrum analyzer system which is capable of connecting an RF section module to a standard oscilloscope or other display with but a single cable or "Y axis" interconnect.

A second object of the present invention is to provide such a spectrum analyzer in which the RF section provides a separate sync pulse superimposed upon the "Y" interconnect video signal.

A further object of the present invention is to provide such a sync interconnect pulse which is usable by the scope to trigger the time-based X axis deflection circuits normally resident within the scope.

These objects are met in the present invention which is a spectrum analyzer system having a single signal cable between the RF section and the display unit. The RF section is miniaturized to fit within a probe handle.

The invention eliminates the scope horizontal (or X) input connection to allow for a single shielded connection between an RF section and a scope or display module. This allows the system to incorporate any presently available scope, since no X input is required. This reduces interconnection wiring to a single cable and therefore allows rapid exchange, on a given scope, with other scope accessories, such as low capacity probes.

This ability to rapidly interchange the use of a standard scope is accomplished because of the single able interconnect. This unit has RF, sweep and power supply sections built within a handheld enclosure for servicing uses and other uses by non-engineering personnel.

An RF section module contains the circuitry for a narrow band, frequency-swept receiver. The frequency scanning is performed over a relatively large range, with an essentially linear relationship between frequency and sweep time. Ramp circuits cause this frequency scanning vs time linearity. The RF section module also contains a logarithmic amplifier/detector which causes RF signal amplitude to be converted into a logarithmic voltage (video), which is output to the display module as a vertical (Y axis) display on a standard scope.

A synchronizing (sync) pulse is generated by the RF section module circuitry and placed in time between the highest and the lowest frequency to be displayed and then added to the video signal output to the scope vertical (Y) input. This sync pulse is used by the scope trigger circuits to jump the scope horizontal back to the left side of the display, after which the scope generates a linear horizontal deflection versus time. As noted before, the probe circuitry internally sweeps frequency versus time essentially linearly. Thus, the scope displays the desired horizontal, linearly related to receiver frequency, with no separate horizontal input. The scope displays the desired vertical, with deflection proportional to the logarithm of the input RF (decibels). The frequency and amplitude limits are still established by the spectrum probe and the scope controls can be used to expand portions of the display.

DESCRIPTION OF THE DRAWINGS

The features, advantages and operation of the invention can be understood from a reading of the following Detailed Description of the Invention in connection with the accompanying drawings in which like numerals refer to like elements and in which:

FIG. 3 is a display of vertical (Y) input signals to the scope of the present invention from the probe unit circuitry;

FIG. 4 is a block diagram of the circuitry of the handheld probe unit with germane components identified.

DETAILED DESCRIPTION OF THE INVENTION

The present invention is an improved spectrum analyzer system. The improvement includes an improved RF section circuit and the use of the time-based circuits, normally resident within an oscilloscope circuitry, to provide a frequency spectrum display from only a Y signal input.

The invention focuses on the generation of a compound video Y input signal with both frequency information and repeat sync information. A predistortion circuit provides precompensation for ramp signal generation non-linearity. The result is the elimination of the previosly necessary (X) horizontal input interconnect between the RF section and the scope.

Figure 1:
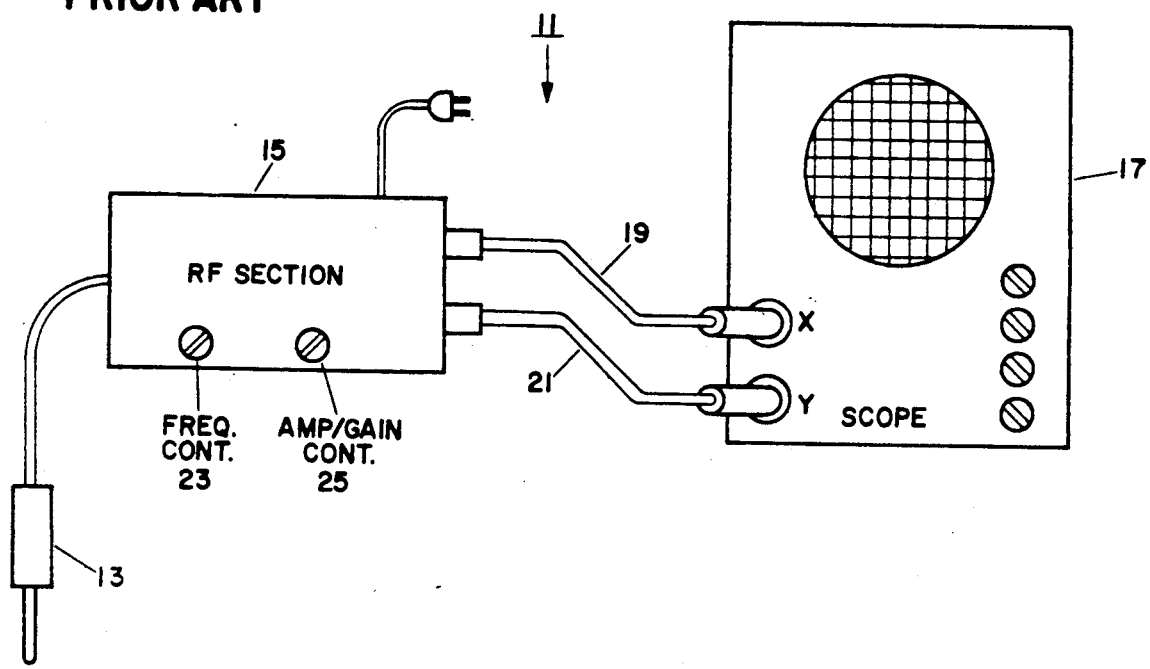
FIG. 1 is a representation of an equipment setup of one type of prior art spectrum analyzer system which uses both X and Y inputs to a scope.

A prior art spectrum analyzer 11, FIG. 1, has a simple input 13, an RF section circuit 15 connected to the input 13 and an oscilloscope 17 connected to the RF section 15 through a pair of cables 19, 21. The cables 19, 21 carry the X input and Y input signals, respectively, to the scope 17. Frequency 23 and amplitude/gain 25 controls are included in the RF section circuit.

A signal, where voltage is essentially proportional to RF receiver frequency, is sent between the RF module 15 and the scope display 17. The source of this voltage is a ramp signal, usually generated within the RF module 15, as a function of the receiver frequency.

Figure 2:
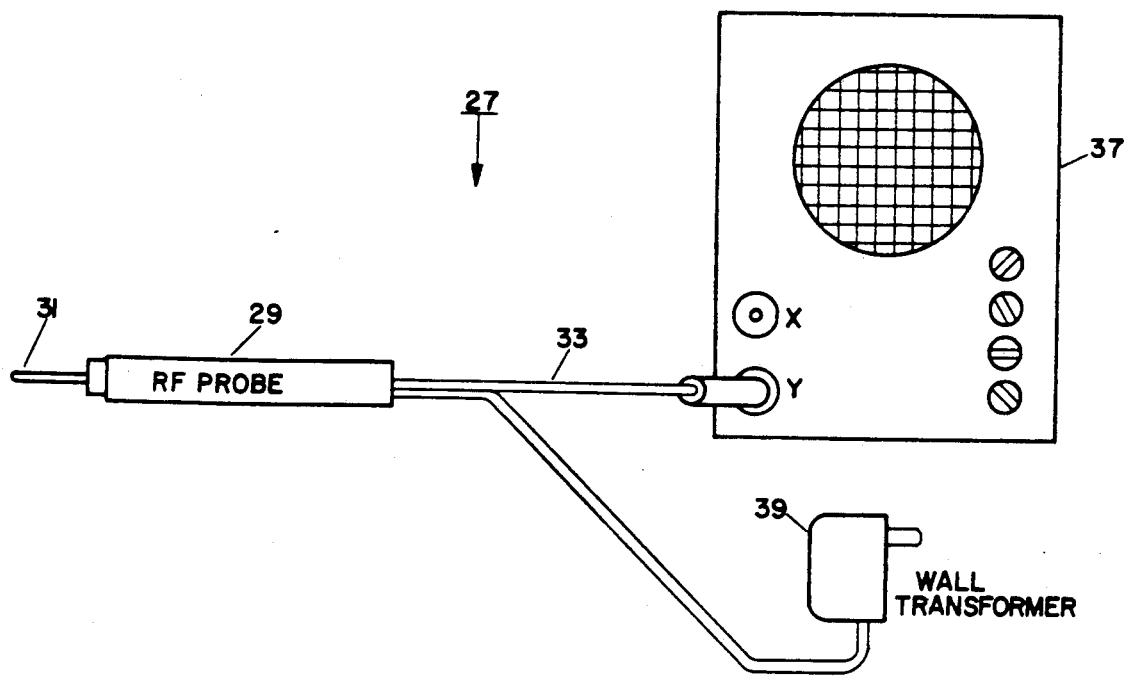
FIG. 2 shows an equipment setup of the present invention.

The present invention 27, FIG. 2, contains a miniturized RF section module positioned within a hand-held probe unit 29, FIG. 2. This probe unit 29 has a simple probe tip or pin 31. It can perform the same function as the simple probe tip 13 of the prior art. In the present design, the tip is designed to minimum circuit loading rather than 50 ohms.

A single shielded cable interconnect 33 connects the output from the probe 29 circuitry to the (Y) vertical input 35 of a standard scope 37. A 15 volt wall transformer 39 supplies power to the probe unit 29.

The apparatus 27 operates as a RF spectrum analyzer. An RF spectrum analyzer is an instrument/system which produces a vertical, usually logarithmic, display of RF signal amplitude plotted against a horizontal, usually linear, display of RF signal frequency. This is accomplished by displaying vertically the (log converted) output of a narrow band receiver, as the reception frequency (displayed horizontally) of this receiver is swept, usually from the lowest to the highest desired.

In the preferred embodiment, shown in FIG. 2, there are only three elements: the RF circuitry bearing probe 29, the standard scope 37 and the wall transformer 39. The wall transformer 39 is of conventional design, and supplies 15 volt AC power to the RF circuitry probe 29 while providing safety isolation from the power line. Power consumed by the RF circuitry probe 29 is about one watt.

The scope is any standard type commonly found in the marketplace. Vertical sensitivity should be about 0.05 V per cm. Vertical bandwidth need only exceed 0.5 MHz. Horizontal deflection is normally set about 0.5 ms per cm. But, it is desirable to have ×10 multiplier and 50 microsecond per cm, or delayed sweep capability for closer examination of portions of the waveform.

The RF section module contains elements: (a) a narrow band swept receiver; (b) a logarithmic conversion of RF level to output voltage; (c) a ramp source causing the receiver frequency to vary; (d) those circuits necessary to generate a unique synchronizing pulse added to the output voltage; and (e) circuits to convert the input AC supply power into the necessary DC supplies to operate the circuitry.

The presence of a pulse or other information used for synchronization is unique. The circuits of those (a)-(e) discussed above which are used to generate and add the unique sync pulse are (c) the ramp source and (d) the sync generation circuits. The others are typical in design consistant with the literature, such as RF Design magazine, March/April 1981 issue, pages 30-34.

Referring to FIG. 3, there is shown a typical video signal waveform 39 from the RF circuit probe 29 for input to the scope 37 vertical input (Y) 35. The waveform 39 can include a plurality of frequency spikes from the lowest frequency 41a to the highest frequency 41b. These all extend vertically from a horizontal reference base line 43 which is the amplitude level with residual noise. At the end of each cycle (sweep) at a location between the highest frequency 41b and the lowest frequency 41a is positioned a repeating, negative going sync pulse 45. The addition and use of this sync pulse 45 is an invention.

These synchronizing pulses 45 are generated within the RF circuitry resident within the probe 29. It may be seen that the pulse parameters are not critical.

Parameters for these pulses 45 include:

(A) As excessive duration reduces the effective CRT brightness, while a very short duration may introduce recovery transients into subsequent signals, about 5% of the total period duration has been found to be a good compromise for the width of each pulse 45.

(B) Pulse 45 polarity is reversed relative to the input amplitude display. This blanks the CRT during retrace, to avoid spurious lines on the scope.

(C) Pulse 45 amplitude is not critical. Excessive amplitude will reduce the scope's vertical dynamic range, reducing the ability to expand a portion of the vertical display. If the amplitude is too small, unreliable/critical scope triggering will result. A pulse magnitude about one half that of saturated output above noise has been found to be a good comprimise.

The generation, insertion, and other circuit additions to provide this ramp source and sync pulse will now be discussed.

A ramp and pulse source circuit 47, FIG. 4, provides on a first output, a pulse train of negative going pulses 49. This pulse train is connected through a resistor 51 to a circuit node 53. Resistor 51 is 6.8k ohms. This ramp and pulse source circuit 47 also provides a second output, a ramp wave form 63.

As the ramp and pulse source circuit 47 is operated as a resister/capacitor controlled oscillator, the first output is also connected to a second output through a 120k ohm resistor 55. Connected across the resistor 55 is the series connection of a diode 57 and a 4.7k ohm resistor 59. The diode 57 is a type 1N914 diode connected with positive plurality from the second output to the first output of ramp pulse source 47. The second output has a 0.22 microfarad capacitor 61 connected to ground.

The second output of the pulse source generator 47 therefore provides an sawtooth waveform 63. This sawtooth waveform 63 is distorted by its connection into a circuit 65. This circuit 65 has a connection containing a 270k ohm resistor 67 from its output to input. The output of this circuit 65 is fed through a sweep width adjustment resistor 69. Resistor 69 is an adjustable 10k ohm resistor to ground.

The wiper from the 10k ohm resistor 69 is fed through a 68k ohm resistor 71 to a first input of an operational amplifier 73 which operates as an inverting buffer. This operational amplifier 73 has its other input (positive or non-inverting) connected to ground. All active circuit components including the ramp and pulse source have both plus and minus 12 volt DC power supplies connected to them in a conventional manner. Resistor 75 which is a 100k ohms is connected across the amplifier 73. The (inverting or negative) input to the OP AMP 73 also has 180k ohm resistor 77 connected to a variable voltage resistor 79. The variable resistor 79 is a 10k ohm resistor connected between +12 volts and −12 volts. The wiper of this resistor 79 is connected through the 180k ohm resistor 77 to the input OP AMP 73.

The output of the OP AMP 73 is a sawtooth waveform 81 having a sharp rise and a non-linear fall-off. This second sawtooth 81 is connected through a 10k ohm resistor 83 to an interface circuit 85. The interface circuit 85 comprises a network having a 390 picafarad capacitor 87 and and a voltage variable capacitor diode 89 connected in series with an inductor 91 connected across the capacitor 87. The inductor 91 is connected across the inputs of an oscillator sweep generator 93. The inductor 91 and capacitor 87 connection is biased to +12 volts DC. This oscillator sweep generator 93 is setup to operate between approximately 150 MHz and 250 MHz.

The input 95 (from pin 31 of FIG. 2), is fed into a 1 MHz to 100 MHz bandpass filter 97. The output from this bandpass filter 97 is connected into a first mixer circuit 99 along with the output from the oscillator sweep generator 93. The output from this first mixer 99 is connected to fed into a 150 MHz bandpass filter 101.

The output from the second oscillator 103 is sent to a second mixer circuit 107, along with the output from the 150 MHz bandpass filter 101.

Output from the second mixer 107 is connected through a 10.7 MHz bandpass filter 109 to a logarithmic converter comprising a first multistage amplifier 111 which receives the output from the 10.7 MHz bandpass filter 109 on its input.

This multistage amplifier 111 is connected, as will be described below, to a +8 volts power supply and connected to a log detector circuit 113.

The output from the 150 MHz bandpass filter 103, is also connected through a 1N914 diode 115 to circuit node 53. At circuit node 53, it is added to the negative pulse train 49 which has been passed through the resistor 51. The signal at circuit node 53 is then passed through a 33k ohm resistor 117 to circuit node 119. This signal at circuit node 119 is added to the signal output from the log detect circuit 113 and passed on to the output 121 which is the composite video signal 39 of FIG. 3 to the scope 37 of FIG. 2.

The second sawtooth waveform 81 ramp, or VCO control voltage, provides bias voltage to the voltage variable capacitor diode 89. This, in combination with other RF components such as inductor 91, controls the RF receiver frequency. When the other RF receiver components are fixed:

(A) The most positive ramp 81 voltage establishes the minimum receiver frequency;

(B) The most negative ramp 81 voltage establishes the maximum receiver frequency; and (C) A non-linear relationship exists between ramp voltage 81 and receiver frequency.

This complex relationship is available in the literature and depends upon the properties of the diode 89, the stray capacitance of the first oscillator input pins and the relationship of this first oscillator frequency range (150 MHz to 250 MHz) to the input 95 RF frequency range (0 to 100 MHz).

The pulse 49 train serves two functions. The negative sync pulse 49, applied through resistor 51, causes the diode 115 to conduct. This, in turn, unbalances the second mixer 107. The second mixer 107 is, therefore, gated off by this pulse 49 and ceases outputting RF signals to 10.7 MHz bandpass filter 109 during this sync period. This stops undesired signals from appearing on the video signal output 121 during the sync period.

The second function of pulse 49 is to cause the sync pulse 45 to appear in the video signal output 121. This is accomplished by adding the negative pulse 49 to the output of log detector 113 at the circuit node 119 side of resistor 117. This creates the presence of the negative pulse 45 into the output thereby creating the desired repeating sync pulse 45.

Having now established how the sawtooth waveform 81 and negative pulse 49 are used by the RF section of the circuitry, the generation of the sawtooth waveform 81 and pulse 49 will now be described.

Figure 5:
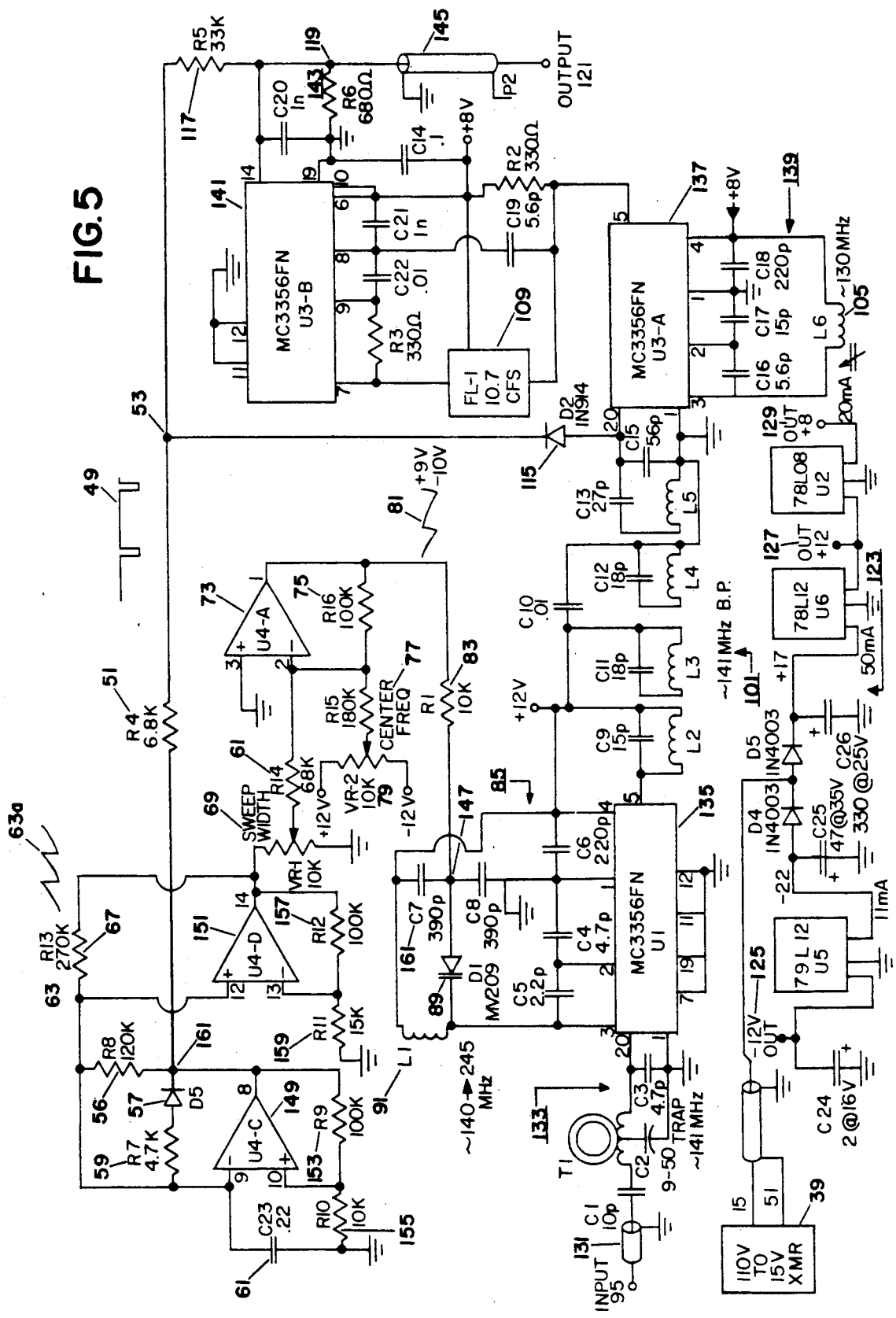
FIG. 5 is schematic of the circuitry within the probe RF module.

A schematic of the miniaturized RF section circuitry positioned within the hand-held probe 29 of FIG. 2, is shown in detail in FIG. 5. The 15 volt AC output from the wall transformer 39 is connected into a common power supply 123, FIG. 5. This power supply provides a −12 volts DC output 125, a +12 volts DC output 127 and a +8 volts DC output 129.

The pin 31 input 95 is connected through a 10 picafarad capacitor to a 1 to 100 MHz bandpass filter 133. This bandpass filter 133 can be implemented in a number of common ways.

The output of the lowpass filter 97, is input into a first mixture circuit which includes a Motorola Corporation MC 3356FN integrated circuit 135. The output from this integrated circuit 135, is fed to the 150 MHz bandpass filter 101 of FIG. 4. Here the filter 101 has been adjusted to approximately 141 MHz. This filter 101 can be implemented in a number of common ways.

The output from the bandpass filter 101 is input into a second Motorola Corporation integrated circuit MC 5536FN 137 which acts as the second mixer 107 of FIG. 4. This second integrated circuit 137 has the capacitor circuit 139 connected across its pins 1, 2, 3 and 4. The output from this second integrated circuit 137, pin 5, is connected into the 10.7 MHz or other frequency bandpass filter 109 which is then connected to an amplifier and log detector circuit (AMP 111 and log detect circuit 113 of FIG. 4) being implemented by the Motorola integrated circuit MC 3356FN 141 and the attendant capacitors and resistors connected to this integrated circuit. These connections and component values are described in the manufacturer's literature. The output from this circuit 141 appears across the RC output filter 143.

This output is connected to appear on the circuit node 119, which is likewise connected to a shielded cable 145 to form the output 121 to the scope 37 of FIG. 2.

The input of the second mixer integrated circuit 137 is connected through a 1N914 diode 115 and then a 33 k ohm resistor 117 to the circuit node 119.

The oscillator circuit 85 of FIG. 4 is connected to the first mixer implemented by the integrated circuit 135. The connections are made on pins 1, 2, 3 and 4 of integrated circuit 135. This integrated circuit 135 is connected to operate between about 140 MHz and 245 MHz. The oscillation frequency of circuit 85 is established by the capacitor, and the inductor 91, as well as the voltage variable capacitor diode 89. This diode 89 is implemented by a Motorola diode model MV209. The anode side of this diode 89 is connected to a circuit node 147 which in turn is connected to receive the sawtooth waveform 81 through the 10 k ohm resistor 83.

The ramp pulse source 47 of FIG. 4 is implemented by the resistor capacitor controlled oscillator, operational amplifier 149, and its attendant circuitry connected according to conventional means. The predistortion circuit 65 of FIG. 4, is likewise implemented with an operational amplifier 151. The resistors 56, 59 and capacitor 61, as well as the diode 57 shown in FIG. 4 are shown in FIG. 5. Also shown is a 100 k ohm resistor 153 from pin 8 to pin 10 of the operational amplifier 149.

The predistortion circuit 65 is implemented with the operational amplifier 151 and resistors 157 and 159, with resistor 157 being 100 k ohms and resistor 159 being 15 k ohms.

The 270 k ohm resistor 67 is connected from pin 14 to pin 12 of integrated circuit 151. Pin 12 is the plus or non-inverting input of the operational amplifier 151. The pulses 49 are fed through the 6.8 k ohm resistor 51 and the 33 k resistor 117 to the circuit node 119.

Amplifier 73 of FIG. 4 is also shown on FIG. 5. The circuitry attendant to this amplifier 73, including resistor 75, resistor 77, variable resistor 79, input resistor 61 and variable input resistor 69 are likewise shown on FIG. 5.

The circuits operate as follows. Integrated circuit 149 functions as an oscillator. Two signals are output. The negative pulse 49 is output from IC 149, pin 8. The sawtooth waveform 63 is present, at low level, on IC 149, pin 9 and IC 151, pin 12. It may be seen that IC 149 is an OP AMP connected to resistors 56, 153 and 155, plus capacitor 61. These form a conventional linear oscillator. In the absence of resistor 59 and diode 57, this oscillator would have an output of a 50 percent duty cycle square wave, and an output of a low amplitude linear positive and negative ramp.

Diode 57 and resistor 59 are added in parallel with the normal timing resistor 56. This diode 57 places the resistor 59 in parallel with the resistor 56 during the negative output period of the oscillator, thereby greatly reducing the negative output duration of the signal, but having little affect on the positive output duration. Thus, the resistor 59 plus diode 57 operate to create a short negative going pulse output after the relatively long positive normal sweep time.

During the positive pulse output time, the voltage present at the oscillator 149 negative (inverting) input, pin 9, would normally increase essentially linearly with time. However, the signal at this point is caused to be non-linear by the loading on this point by the resistor 67 connected from the predistortion circuit operational amplifier 151, pin 14. It is to be noted that the positive input pin 12 of operational amplifier 151 is connected directly to the negative input pin 9 of operational amplifier 149.

As may be seen from FIG. 5, operational amplifier 151 biasing/gain control resistors 157 and 159 are connected as shown in the literature. However, the addition of the resistor 67 is new and causes a non-linear discharge of the capacitor 61 which is a function of the output of the operational amplifier 151. This predistortion causes the input waveform 63 and output waveform 63a to exhibit a non-linearity. The waveforms 63 and 63a differ oly in magnitude.

This predistortion of the sweep waveform 63 causes the slope of voltage versus time applied to the voltage variable capacitor diode 89 to be relatively slow at the low frequency/low biased startup sweep, and the slope to increase toward the high frequency/high biased end of the sweep. This is defined as an RL type charge/discharge.

The voltage variable capacitor diode 89 is also chosen to minimize frequency versus bias linearity error and this predistortion further improves the desired linear relationship between frequency and time during the sweep.

Operational amplifier 73 together with resistors 61, 75 and 77, form a conventional inverting buffer circuit. The variable resistor 69 is used to set the output sweep voltage between minimum and maximum to the desired level of about 19 volts peak to peak. The adjustable resistor 79 is used to offset the center of the output sweep voltage (signal 81) from zero volts DC. The result is a slightly distorted negative going ramp with a rapid positive slope swinging between +9 volts and −10 volts DC.

This ramp/sweep (sawtooth waveform 81 is applied through resistor 83 to the voltage variable capacitor diode 89 of the receiver first oscillator. This diode 89 is DC referenced to +12 volts. The diode reverse bias therefore is swept from about 3 volts to about 22 volts. The resistor 83 and capacitor 161 serve to isolate the sweep source waveform 81 from the RF on the diode 89.

Consistent with the discussion above, the composite signal at node 119 which therefore is passed to the output 121 is connected to the Y input of a conventional scope. The invention processes about a 0.2 volt change in output with a 40 DB change in RF input. The sync pulse 45 amplitude would be about 0.2 volts.

With proper adjustment of the scope 37 controls, this output 121 waveform will cause the desired spectrum analyzer display to be presented on the scope 37, since the scope 37 can be triggered or locked to the sync pulse 45. No other connections are required.

The above description is intended to be illustrative of the invention and is not to be taken in the limiting sense. Various changes and alterations can be developed to this invention without departing from the intent and scope thereof. These changes and modifications are intended to be within the scope of this invention.

What is claimed is:

1. A method of operating a spectrum analyzer system, said system being limited to a single probe module with a single pin input to an RF section module circuit located within said probe module and an oscilloscope display module having time based circuitry and at least a Y input and a common ground wherein but a single signal wire plus ground is used between said probe module and said oscilloscope Y input and said common ground, this method comprising the following steps:

processing frequency spectrum information received by said pin input within said RF section module circuit;

generating synchronizing information within said RF section module circuit and adding it into said processed frequency information thereby creating a composite video signal with sync (synchronizing information) which is then sent to said oscilloscope display module vertical Y input; and adjusting said oscilloscope display module time based circuits to trigger on said periodic synchronizing information portion of said composite video signal.

2. The method of claim 1 wherein said synchronizing information is a repetitive sync pulse.

3. The method of claim 2 wherein said sync pulse is located in time between the maximum frequency and the minimum frequency of said frequency information processed.

4. The method of claim 3 wherein said frequency processed information is displayed as logarithmic vertical amplitude and said repetitive sync pulse is displayed as a negative sync pulse.

5. The method of claim 4 wherein said sync pulse has a width which is about a 5 percent duty cycle of the total period width.

6. The method of claim 5 wherein said sync pulse amplitude is less than about 50 percent of the maximum spectrum signal voltage minus residual noise.

7. A spectrum analyzer system comprising:
an RF receiver circuit having a single probe pin input and a single signal line output;
an oscilloscope having a Y vertical input circuit;
a connection between the single signal line output of said RF receiver circuit and said oscilloscope Y vertical input circuit; and
wherein said RF receiver circuit includes a pulse source circuit for generating a synchronizing pulse, and a separate predistortion circuit for generating a sharply positive slope and non-linear negative slope sawtooth waveform, said RF receiver circuit providing on its output a voltage amplitude related to the RF signal amplitude as the reception frequency is varied by the sawtooth plus said synchronizing pulse, all in repetitive sequence.

8. An improved method of operating a spectrum analyzer system containing an RF section module having a single pin input and a display module having internal timing circuitry and possessing a vertical input with an interconnect between these modules carrying composite video information (video information with sync) to said vertical input of said display module, the improved method of operation comprising the steps of:
generating synchronizing information within said RF section module;
processing frequency spectrum information received by said pin input, within said RF section module, said frequency spectrum information processing being performed as a function of said synchronizing information generated thereby creating a video signal with sync; and
inputting said video signal with sync to said vertical input of said display module to generate a spectrum display wherein said display module internal timing circuitry utilizes said sync.

9. The method of claim 8 wherein the step of generating synchronizing information includes placing a sync pulse between video signals at a location in time between reception of the maximum frequency and minimum frequency.

10. The method of claim 8 wherein the step of generating synchronizing information includes placing a negative sync pulse on said video information and wherein said video information includes positive vertical amplitudes.

11. The method of claim 9 wherein said display module is implemented by a standard oscilloscope.

* * * * *